US011494642B2

(12) United States Patent
Cho et al.

(10) Patent No.: US 11,494,642 B2
(45) Date of Patent: Nov. 8, 2022

(54) THICKNESS PREDICTION NETWORK LEARNING METHOD, SEMICONDUCTOR DEVICE MANUFACTURING METHOD, AND SEMICONDUCTOR MATERIAL DEPOSITION EQUIPMENT

(71) Applicant: SAMSUNG ELECTRONICS CO., LTD., Suwon-si (KR)

(72) Inventors: Su-il Cho, Seoul (KR); Sung-yoon Ryu, Suwon-si (KR); Yu-sin Yang, Seoul (KR); Chi-hoon Lee, Seoul (KR); Hyun-su Kwak, Daejeon (KR); Jung-won Kim, Daejeon (KR)

(73) Assignees: Samsung Electronics Co., Ltd., Suwon-Si (KR); Korea Advanced Institute of Science and Technology, Daejeon-Si (KR)

( * ) Notice: Subject to any disclaimer, the term of this patent is extended or adjusted under 35 U.S.C. 154(b) by 315 days.

(21) Appl. No.: 16/678,755

(22) Filed: Nov. 8, 2019

(65) Prior Publication Data
US 2020/0193290 A1 Jun. 18, 2020

(30) Foreign Application Priority Data
Dec. 12, 2018 (KR) .................. 10-2018-0160334

(51) Int. Cl.
*G06N 3/08* (2006.01)
*C23C 16/52* (2006.01)
(Continued)

(52) U.S. Cl.
CPC ............. *G06N 3/08* (2013.01); *C23C 16/52* (2013.01); *H01L 22/20* (2013.01); *H01L 27/115* (2013.01)

(58) Field of Classification Search
CPC ...... G06N 3/08; G06N 3/0454; G06N 3/0472; G06N 3/0481; G06N 3/0427; C23C 16/52;
(Continued)

(56) References Cited

U.S. PATENT DOCUMENTS

| 6,598,210 B2 | 7/2003 | Miwa |
| 6,885,467 B2 | 4/2005 | Du-Nour et al. |

(Continued)

FOREIGN PATENT DOCUMENTS

| KR | 10-0769566 B1 | 10/2007 |
| KR | 10-2018-0004046 A | 1/2018 |

*Primary Examiner* — Edward Chin
(74) *Attorney, Agent, or Firm* — Lee IP Law, P.C.

(57) ABSTRACT

A thickness prediction network learning method includes measuring spectrums of optical characteristics of a plurality of semiconductor structures each including a substrate and first and second semiconductor material layers alternately stacked thereon to generate sets of spectrum measurement data, measuring thicknesses of the first and second semiconductor material layers to generate sets of thickness data, training a simulation network using the sets of spectrum measurement data and the sets of thickness data, generating sets of spectrum simulation data of spectrums of the optical characteristics of a plurality of virtual semiconductor structures based on thicknesses of first and second virtual semiconductor material layers using the simulation network, each of the first and second virtual semiconductor layers including the same material as the first and second semiconductor material layers, respectively; and training a thickness prediction network by using the sets of spectrum measurement data and the sets of spectrum simulation data.

2 Claims, 19 Drawing Sheets

(51) Int. Cl.
*H01L 27/115* (2017.01)
*H01L 21/66* (2006.01)

(58) Field of Classification Search
CPC ....... H01L 22/20; H01L 27/115; H01L 22/12; H01L 22/24; H01L 27/11524; G01B 11/06
See application file for complete search history.

(56) References Cited

U.S. PATENT DOCUMENTS

| | | |
|---|---|---|
| 7,420,163 B2 | 9/2008 | Schueler |
| 9,490,183 B2 | 11/2016 | Jin et al. |
| 2007/0249071 A1 | 10/2007 | Lian et al. |
| 2009/0307163 A1* | 12/2009 | Jang ................... G01B 11/0683 |
| | | 702/170 |
| 2020/0185240 A1* | 6/2020 | Kim ................... G01N 21/9501 |
| 2020/0218844 A1* | 7/2020 | Feng ....................... G06F 30/23 |

* cited by examiner

THICKNESS PREDICTION NETWORK LEARNING METHOD, SEMICONDUCTOR DEVICE MANUFACTURING METHOD, AND SEMICONDUCTOR MATERIAL DEPOSITION EQUIPMENT

CROSS-REFERENCE TO RELATED APPLICATION

Korean Patent Application No. 10-2018-0160334, filed on Dec. 12, 2018, in the Korean Intellectual Property Office, and entitled: "Thickness Prediction Network Learning Method, Semiconductor Device Manufacturing Method, and Semiconductor Material Deposition Equipment," is incorporated herein by reference in its entirety.

BACKGROUND

1. Field

Embodiments relate to a thickness prediction network learning method, a semiconductor device manufacturing method, and semiconductor material deposition equipment. In more detail, embodiments relate to a thickness prediction network learning method, a semiconductor device manufacturing method, and semiconductor material deposition equipment, which measures thickness in real time.

2. Description of the Related Art

Recently, research and development on three-dimensional (3D) NAND flash memory devices has been intensive. In 3D NAND flash memories, since memory cells are vertically stacked, a spatial limitation of each flat memory has been solved, and the 3D NAND flash memories have a degree of integration and power efficiency that are higher than those of flat flash memories.

In order to manufacture 3D NAND flash memories, 100 or more silicon oxide and silicon nitride layers are iteratively stacked on a substrate. In the related art, a transmission electron microscope (TEM) is used for measuring the thickness of stacked silicon oxide and silicon nitride layers. However, thickness measurement by the TEM is a destructive inspection method which cuts into formed semiconductor structure, and due to this, makes it fundamentally impossible to perform total inspection and much time and cost are required.

SUMMARY

According to an aspect, there is provided a thickness prediction network learning method including measuring spectrums of optical characteristics of a plurality of semiconductor structures each including a substrate and first and second semiconductor material layers alternately stacked on the substrate to generate sets of spectrum measurement data, measuring thicknesses of the first and second semiconductor material layers to generate sets of thickness measurement data, training a simulation network by using the sets of spectrum measurement data and the sets of thickness measurement data, generating sets of spectrum simulation data which are data, generated by using the simulation network, of spectrums of the optical characteristics of the plurality of semiconductor structures based on the thicknesses of the first and second semiconductor material layers, and training a thickness prediction network by using the sets of spectrum measurement data and the sets of spectrum simulation data.

According to another aspect, there is provided a semiconductor device manufacturing method including measuring spectrums of optical characteristics of a plurality of first semiconductor structures each including a first substrate and first and second semiconductor material layers alternately stacked on the first substrate to generate sets of first spectrum measurement data, measuring thicknesses of the first and second semiconductor material layers to generate sets of thickness measurement data, training a simulation network by using the sets of first spectrum measurement data and the sets of thickness measurement data, generating sets of spectrum simulation data which are data, generated by using the simulation network, of spectrums of the optical characteristics of the plurality of first semiconductor structures based on the thicknesses of the first and second semiconductor material layers, training a thickness prediction network by using the sets of first spectrum measurement data and the sets of spectrum simulation data, forming a plurality of second semiconductor structures each including a second substrate and third and fourth semiconductor material layers alternately stacked on the second substrate, measuring spectrums of optical characteristics of the plurality of second semiconductor structures to generate sets of second spectrum measurement data, and calculating thicknesses of at least some of the third and fourth semiconductor material layers by using the second spectrum measurement data.

According to another aspect, there is provided a semiconductor material deposition equipment including a deposition module configured to form a semiconductor structure including a substrate and first and second semiconductor material layers alternately stacked on the substrate, an optical measurement module configured to measure spectrums of optical characteristics of the semiconductor structure, a thickness measurement module configured to measure thicknesses of the first and second semiconductor material layers, a simulation network configured to learn based on sets of spectrum measurement data measured by the optical measurement module and sets of thickness measurement data measured by the thickness measurement module and to generate sets of spectrum simulation data which are artificial data of the optical characteristics determined based on the thicknesses of the first and second semiconductor material layers, and a thickness prediction network configured to perform learning by using the sets of spectrum measurement data and the sets of simulation data.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
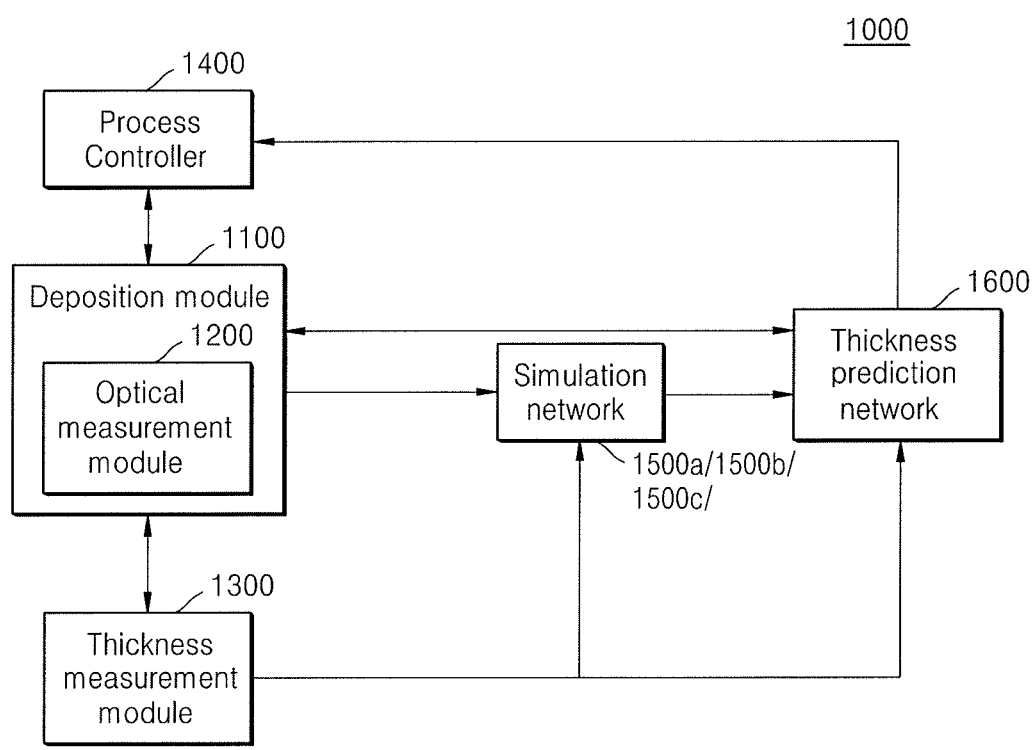
FIG. 1 illustrates semiconductor material deposition equipment according to some embodiments.

Hereinafter, embodiments will be described in detail with reference to the accompanying drawings. Like reference numerals in the drawings denote like elements, and thus, their descriptions will not be repeated. A thickness of a size of each layer in the drawings may be exaggerated for convenience of description and clarity of the specification, and thus, a dimension and a shape of each element may differ from real dimension and shape.

Figure 2:
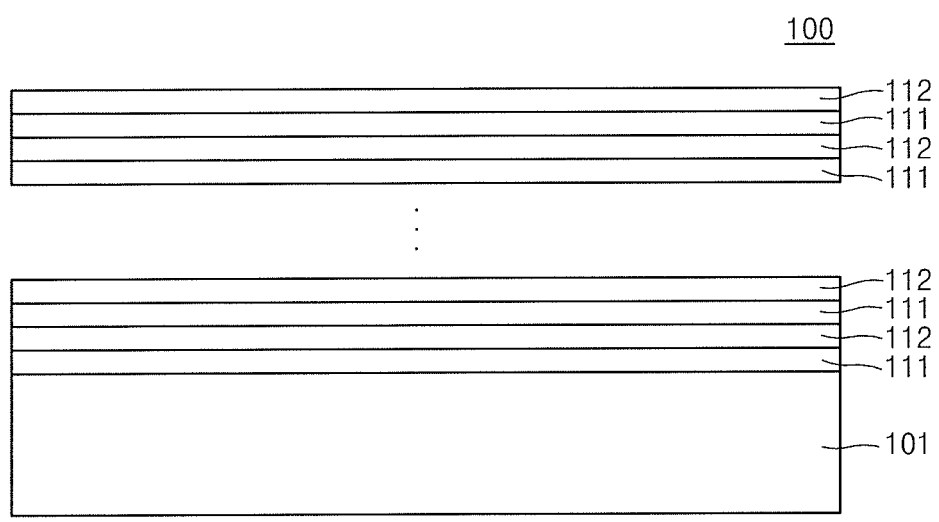
FIG. 2 is a cross-sectional view for describing a semiconductor structure formed by a semiconductor material deposition equipment according to some embodiments.

FIG. 1 illustrates a semiconductor material deposition equipment 1000 according to some embodiments. FIG. 2 is a cross-sectional view for describing a semiconductor structure 100 formed by a semiconductor material deposition equipment according to some embodiments.

Referring to FIGS. 1 and 2, the semiconductor material deposition equipment 1000 may include a deposition module 1100, a thickness measurement module 1300, a process controller 1400, a plurality of simulation networks 1500a to 1500c, and a thickness prediction network 1600.

The deposition module 1100 may perform a deposition process of depositing various semiconductor materials on a substrate 101. According to some embodiments, the deposition module 1100 may perform one or more processes, e.g., molecular beam epitaxy, chemical vapor deposition (CVD), such as atomic layer deposition (ALD), vapor-phase epitaxy (VPE), ultra-high vacuum chemical vapor deposition (UHV-CVD), or the like. According to some embodiments, the deposition module 1100 may form a plurality of first and second semiconductor material layers 111 and 112 alternately stacked on the substrate 101. The substrate 101 may include a bulk silicon substrate, a silicon on insulator (SOI) substrate, a germanium substrate, a germanium on insulator (GOI) substrate, a silicon germanium substrate, an epitaxial thin film substrate obtained by performing selective epitaxial growth (SEG), or the like. The first semiconductor material layers 111 may each include one of polysilicon, silicon nitride, silicon oxide, silicon oxynitride, or the like. The second semiconductor material layers 112 may each include a material differing from that of each of the first semiconductor material layers 111. The second semiconductor material layers 112 may each include a material having etch selectivity that is higher than that of each of the first semiconductor material layers 111. The second semiconductor material layers 112 may each include one of polysilicon, silicon nitride, silicon oxide, silicon oxynitride, or the like.

The deposition module 1100 may include an optical measurement module 1200 or the optical measurement module 1200 may be disposed apart from the deposition module 1100. For example, the optical measurement module 1200 may be adjacent to a transport system for transporting the semiconductor structure 100 to a chamber for a subsequent process.

The deposition module 1100 may include a plurality of chambers and a pre-aligner which aligns substrates processed by the chambers. The pre-aligner may align the substrate 101 before the substrate 101 enters a chamber of the deposition module 1100. When the optical measurement module 1200 is in the deposition module 1100, the optical measurement module 1200 may be adjacent to the pre-aligner and may obtain data of an optical spectrum corresponding to the total number of semiconductor structures 100 on which a deposition process is performed. Measurement by the optical measurement module 1200 may be performed after a series of the deposition process for the semiconductor structures 100 is completed, but is not limited thereto.

According to some embodiments, the optical measurement module 1200 may be triggered by a wafer sensor installed in the pre-aligner. Therefore, when the substrate 101 is located in the pre-aligner, the optical measurement module 1200 may automatically measure a spectrum of the semiconductor structure 100. Accordingly, time is not taken in a separate process of measuring a thickness of the first and second semiconductor material layers 111 and 112, and thus, a total inspection of the semiconductor structure 100 formed may be performed without loss of a turnaround time (TAT).

According to some embodiments, the optical measurement module 1200 may include various devices for inspecting the semiconductor structure 100 formed by the deposition module 1100. According to some embodiments, the optical measurement module 1200 may include a reflectance measurement device 1210 (see FIG. 4A), an ellipsometer 1230 (see FIG. 4B), and a group delay dispersion (GDD) measurement device 1250 (see FIG. 4C). According to some embodiments, the optical measurement module 1200 may measure reflectance, polarization reflectance, polarization reflection delay, and GDD spectrums of the semiconductor structure 100. A configuration of each of the reflectance measurement device 1210, the ellipsometer 1230, and the GDD measurement device 1250 will be described below in more detail with reference to FIGS. 4A to 4C.

The thickness measurement module 1300 may measure a thickness of the semiconductor structure 100. The thickness measurement module 1300 may calculate a thickness of each of the plurality of first and second semiconductor material layers 111 and 112 alternately stacked on a wafer of the semiconductor structure 100, or may calculate a sum of thicknesses of some of the plurality of first and second semiconductor material layers 111 and 112. The thickness measurement module 1300 may measure a thickness of each of the plurality of first and second semiconductor material layers 111 and 112 alternately stacked on a wafer of the semiconductor structure 100, or may measure a sum of thicknesses of some of the plurality of first and second semiconductor material layers 111 and 112. According to some embodiments, the thickness measurement module 1300 may include a TEM. Referring to FIG. 1, the thickness measurement module 1300 is illustrated as being included in the semiconductor material deposition equipment 1000, but may be a separate element.

The process controller 1400 may control an overall operation of the semiconductor material deposition equipment 1000. According to some embodiments, the process controller 1400 may control a deposition process performed by the deposition module 1100 and measurement by the optical measurement module 1200. According to some embodiments, the process controller 1400 may adjust various process parameters used to perform and/or select a process. Examples of the process parameters may include a temperature, pressure, a period time, a process gas composition, a process gas concentration, a chamber application voltage, etc., but are not limited thereto. According to some embodiments, the process controller 1400 may adjust the process parameters, based on a feedback signal from the thickness prediction network 1600. According to some embodiments, the process controller 1400 may be a computing device including one or more software products for controlling operations of the deposition module 1100 and the optical measurement module 1200, e.g., a workstation computer, a desktop computer, a laptop computer, and a tablet computer.

According to some embodiments, the simulation networks 1500a to 1500c may be trained based on sets of optical spectrum data measured by the optical measurement module 1200 and sets of thickness measurement data, which are data of the thicknesses of the first and second semiconductor material layers 111 and 112 measured by the thickness measurement module 1300. According to some embodiments, the simulation networks 1500a to 1500c may generate sets of data which are substantially the same as measured optical spectrum data and thickness measurement data. According to some embodiments, each of the simulation networks 1500a to 1500c may be an artificial neural network. According to some embodiments, each of the simulation networks 1500a to 1500c may include a plurality of calculation nodes corresponding to at least some artificial neurons configuring the artificial neural network, and at least some of the plurality of calculation nodes may process signals in parallel.

Figure 5A:
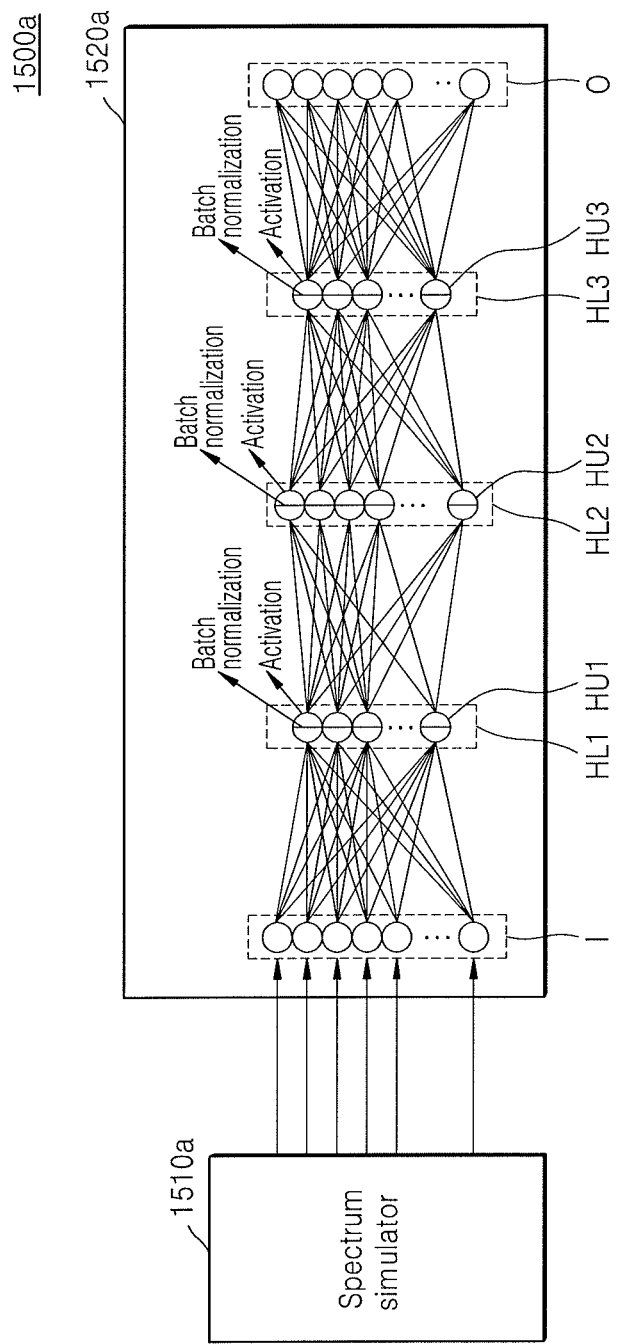
FIG. 5A illustrates a simulation network included in a semiconductor material deposition equipment according to some embodiments.

According to some embodiments, as in FIG. 5A, the simulation network 1500a may generate sets of spectrum simulation data of a reflectance, a polarization reflectance, polarization reflection delay, and GDD according to a thickness of the first and second semiconductor material layers 111 and 112, based on a physical model. According to some other embodiments, as in FIG. 6, the simulation network 1500b may be an unsupervised generative model which allows a generator network and a discriminator network to learn adversarially. According to some other embodiments, as in FIG. 7, the simulation network 1500c may include the simulation network 1500a of FIG. 5A and a simulation of FIG. 6. A configuration and an operation of each of the simulation networks 1500a to 1500c will be described below in more detail with reference to FIGS. 5A to 7. Hereinafter, the term 'learning' may include deep learning which is used in the artificial neural network technology field.

According to some embodiments, the thickness prediction network 1600 may be an artificial neural network. According to some embodiments, the thickness prediction network 1600 may include a plurality of calculation nodes corresponding to at least some artificial neurons configuring the artificial neural network, and at least some of the plurality of calculation nodes may process signals in parallel. A detailed configuration of the thickness prediction network 1600 will be described below with reference to FIG. 8. According to some embodiments, the thickness prediction network 1600 may be trained based on measurement spectrums obtained by the optical measurement module 1200, measurement data obtained by the thickness measurement module 1300, and sets of spectrum simulation data generated by the simulation networks 1500a to 1500c. According to some embodiments, the thickness prediction network 1600 may be trained, and then, may predict a thickness of the first and second semiconductor material layers 111 and 112 included in the semiconductor structure 100, based on the measurement spectrums obtained by the optical measurement module 1200.

Figure 3A:
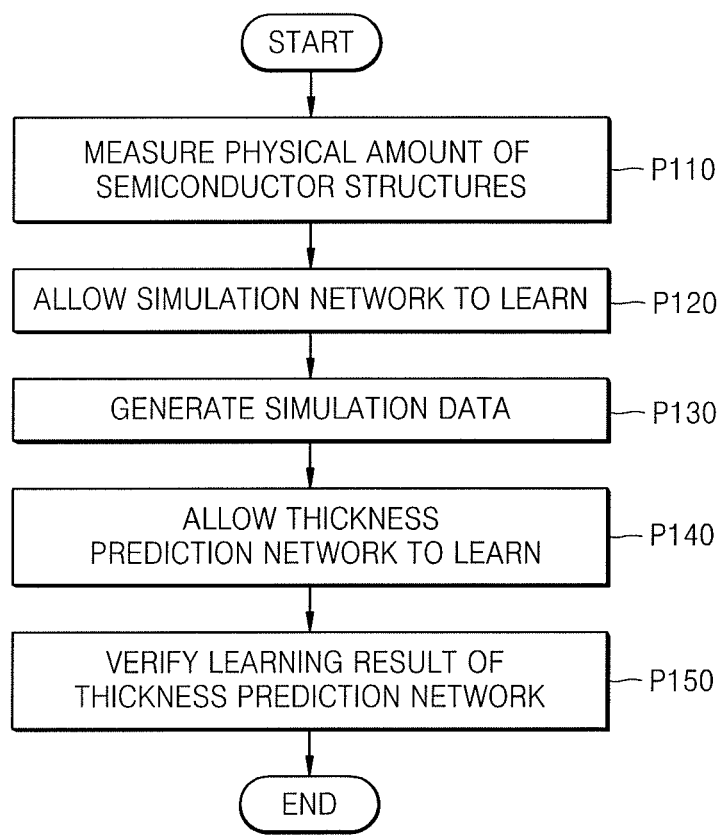
FIG. 3A is a flowchart for describing a thickness prediction network learning method according to some embodiments.
Figure 3B:
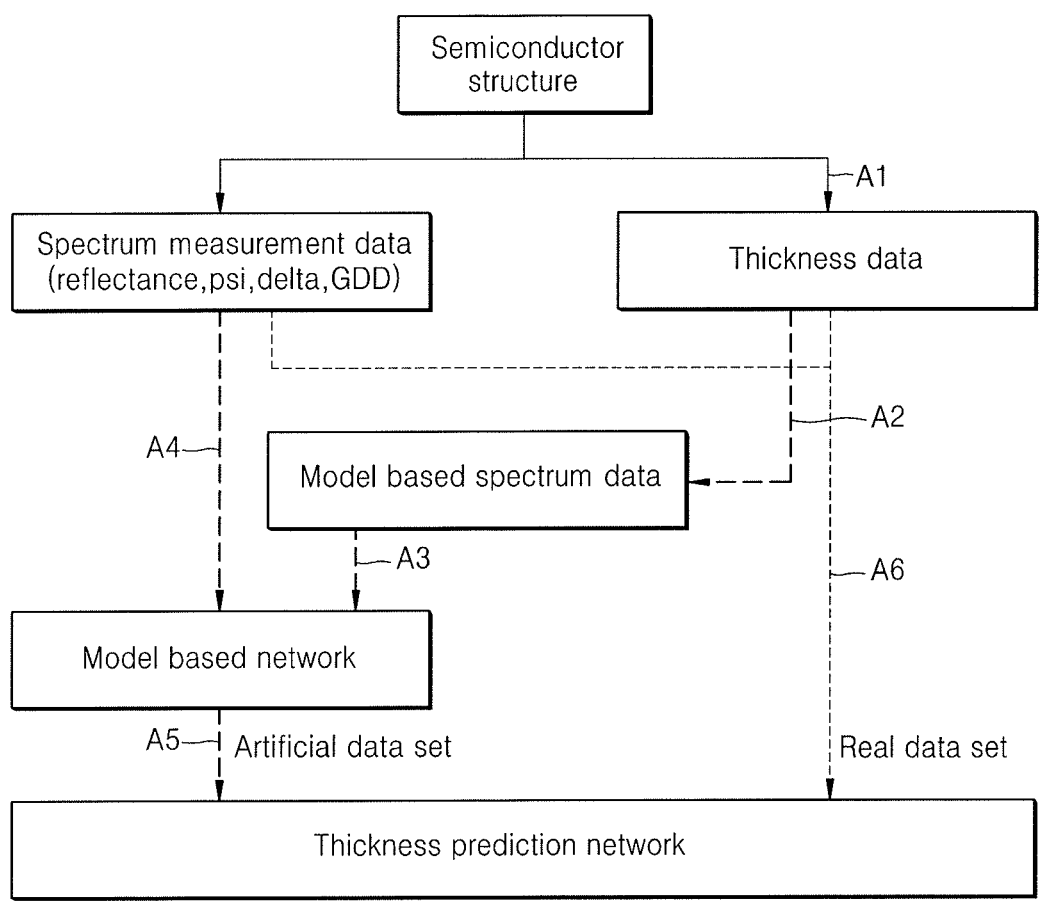
FIG. 3B is a conceptual view for describing a thickness prediction network learning method according to some embodiments.

FIG. 3A is a flowchart of a thickness prediction network learning method according to some embodiments. FIG. 3B is a conceptual view for describing a thickness prediction network learning method according to some embodiments. In more detail, FIG. 3B is a conceptual view illustrating flow of data in the thickness prediction network learning method according to some embodiments.

Referring to FIGS. 1 to 3B, in operation P110, the physical amount of the semiconductor structures 100 may be measured. The measured physical amount may include spectrums of a reflectance, a polarization reflectance, polarization reflection delay, and GDD of each of the semiconductor structures 100. The reflectance, the polarization reflectance, the polarization reflection delay, and the GDD may be measured at a plurality of positions of the semiconductor structures 100. For convenience of description, data of each of the spectrums of the reflectance, polarization reflectance, polarization reflection delay, and GDD of the semiconductor structures 100 measured in a learning process of a thickness prediction network may be referred to as first spectrum measurement data. The measured physical amount may further include a thickness of each of the first and second semiconductor material layers 111 and 112 included in the semiconductor structures 100. A process of obtaining sets of first spectrum measurement data and sets of thickness measurement data from the semiconductor structures 100 in operation P110 is illustrated by an arrow A1 in FIG. 3B.

Figure 4A:
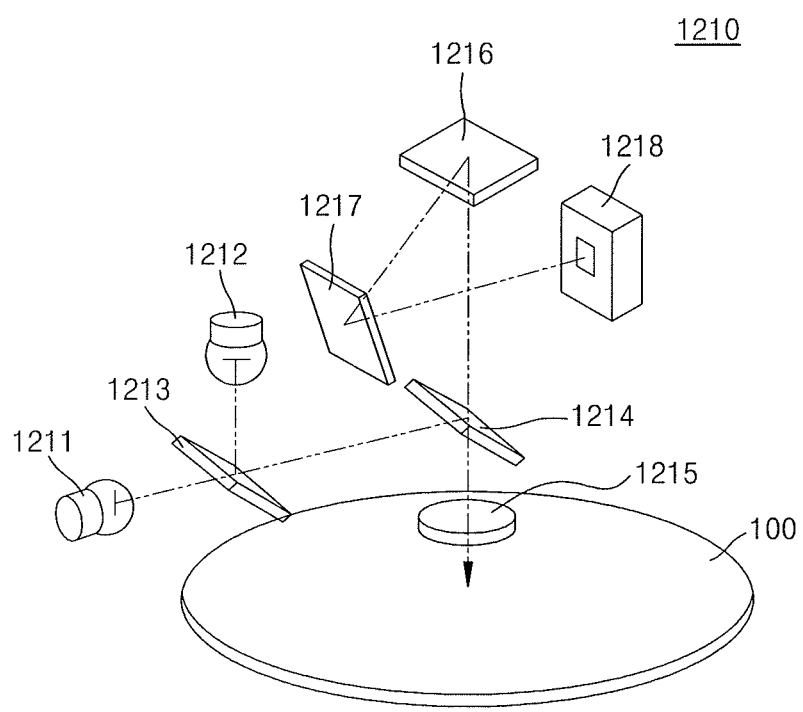
FIGS. 4A to 4C are cross-sectional views for describing an optical measurement module according to some embodiments.

Referring to FIG. 4A for a more detailed description, the reflectance measurement device 1210 may include first and second light sources 1211 and 1212, first and second splitters 1213 and 1214, an objective lens 1215, a mirror 1216, a grating mirror 1217, and a charge coupled device (CCD) camera 1218.

The reflectance measurement device 1210 may measure a spectrum of a reflectance of each of a plurality of semiconductor structures 100. According to some embodiments, the reflectance measurement device 1210 may include, e.g., a spectroscopic reflectometer. According to some embodiments, a reflectance may be measured in a first wavelength band, e.g., an ultraviolet (UV) band, a visible light band, a near-infrared band, an infrared band, and the like, depending upon the semiconductor structure being measured. According to some embodiments, the reflectance measurement device 1210 may include an optical system of a type where light to be measured is incident on the semiconductor structures 100 in a direction substantially vertical thereto.

The first and second light sources 1211 and 1212 may respectively include a deuterium arc lamp and a halogen lamp. According to some embodiments, the first light source 1211 may generate light in a UV band. According to some embodiments, the second light source 1212 may generate light of a visible light band, a near-infrared band, or an infrared band. Therefore, lights of various wavelength bands from infrared light to UV light may be irradiated onto the semiconductor structures 100. Referring to FIG. 4A, the first and second light sources 1211 and 1212 are illustrated as being disposed to irradiate lights in a direction vertical to each other, but are not limited thereto.

The first splitter 1213 may be adjacent to the first and second light sources 1211 and 1212. The first splitter 1213 may reflect a portion of light irradiated thereon and may transmit the other light. According to some embodiments, the first splitter 1213 may be aligned to combine light paths of lights irradiated by the first and second light sources 1211 and 1212. According to some embodiments, light of the second source 1212, reflected by the first splitter 1213, and light of the first light source 1211, passing through the first splitter 1213, may be incident on the second splitter 1214.

The second splitter 1214 may reflect a portion of light irradiated thereon and may transmit the other light. Light reflected by the second splitter 1214 may focus on a certain position of the semiconductor structure 100 using the objective lens 1215. Light reflected to the semiconductor structure 100 may pass through the second splitter 1214 to be incident on the mirror 1216.

The mirror 1216 may change a light path in order for light to be reflected by the grating mirror 1217 before reaching the CCD camera 1218. The grating mirror 1217 may improve a signal characteristic so as to be suitable for spectrum analysis. The CCD camera 1218 may convert transferred light into an electrical signal.

Figure 4B:
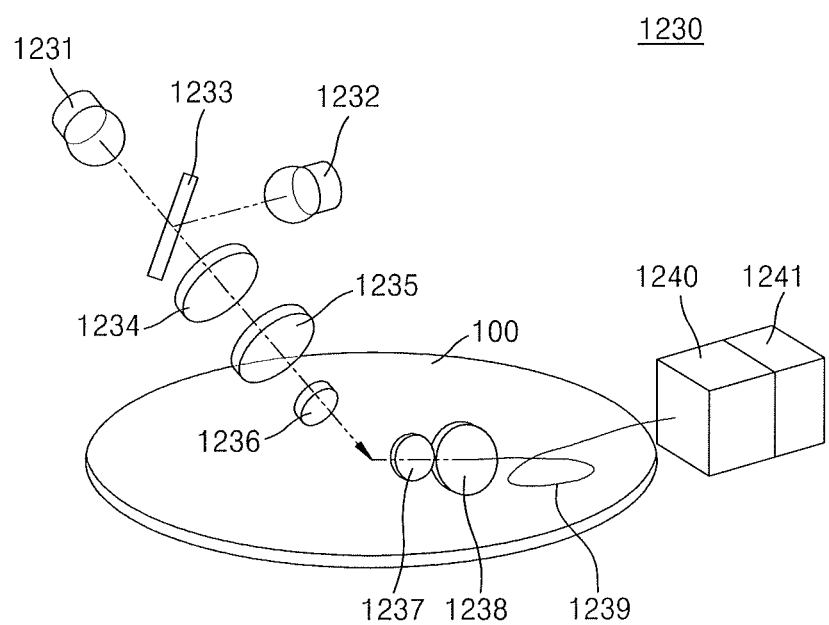

Referring to FIG. 4B, the ellipsometer 1230 may include third and fourth light sources 1231 and 1232, a splitter 1233, a first polarizer 1234, a compensator 1235, a focusing lens 1236, a condensing lens 1237, a second polarizer 1238, a fiber optical system 1239, a spectrometer 1240, and a CCD camera 1241.

According to some embodiments, the ellipsometer 1230 may include, e.g., a spectroscopic ellipsometer. The ellipsometer 1230 may measure a spectrum of an amplitude ratio and a spectrum of a phase difference, for comparing a before-reflection polarization state and an after-reflection polarization state of light reflected to the semiconductor structures 100. According to some embodiments, the amplitude ratio and the phase difference may be measured in a second wavelength band, e.g., a visible light band, a near-infrared band, an infrared band, and the like. According to some embodiments, the second wavelength band may include a wavelength band which is broader than the first wavelength band. According to some other embodiments, the second wavelength band may partially or fully overlap the first wavelength band. According to some embodiments, the ellipsometer 1230 may include an optical system of a type where light is incident on an upper surface of each of the semiconductor structures 100 in a diagonal direction with respect thereto.

The third and fourth light sources 1231 and 1232 may respectively include a deuterium arc lamp and a halogen lamp. According to some embodiments, the third light source 1231 may generate light of a UV band. According to some embodiments, the fourth light source 1232 may generate light of a visible light band, a near-infrared band, or an infrared band. Therefore, lights of various wavelength bands from infrared light to UV light may be irradiated onto the semiconductor structures 100. Referring to FIG. 4B, the third and fourth light sources 1231 and 1232 are illustrated as being disposed vertical to each other, but may be in any suitable configuration.

Similarly to the first splitter 1213 described above with reference to FIG. 4A, the splitter 1233 may match light paths of the third and fourth light sources 1231 and 1232. Light passing through the splitter 1233 may reach the semiconductor structures 100 via the first polarizer 1234, the compensator 1235, and the focusing lens 1236.

Here, the first polarizer 1234 may be an optical filter which transmits light of a first polarization and blocks light of a second polarization. The compensator 1235 may change a polarization state of light passing therethrough. The compensator 1235 may be, e.g., a half wave compensator (or λ/2 plate) which shifts a polarization direction of linear polarization and a quarter wave compensator (or λ/4 plate) which converts linear polarization into circular polarization or converts circular polarization into linear polarization. Depending on the case, the compensator 1235 may be omitted.

Light reflected to the semiconductor structure 100 may be condensed by the condensing lens 1237 and may pass through the second polarizer 1238, referred to as an analyzer. Light passing through the second polarizer 1238 may be incident on the spectrometer 1240 and the CCD camera 1241 by the fiber optical system 1239. The spectrometer 1240 and the CCD camera 1241 may generate an electrical signal corresponding to a polarization reflectance and polarization reflection delay.

Figure 4C:
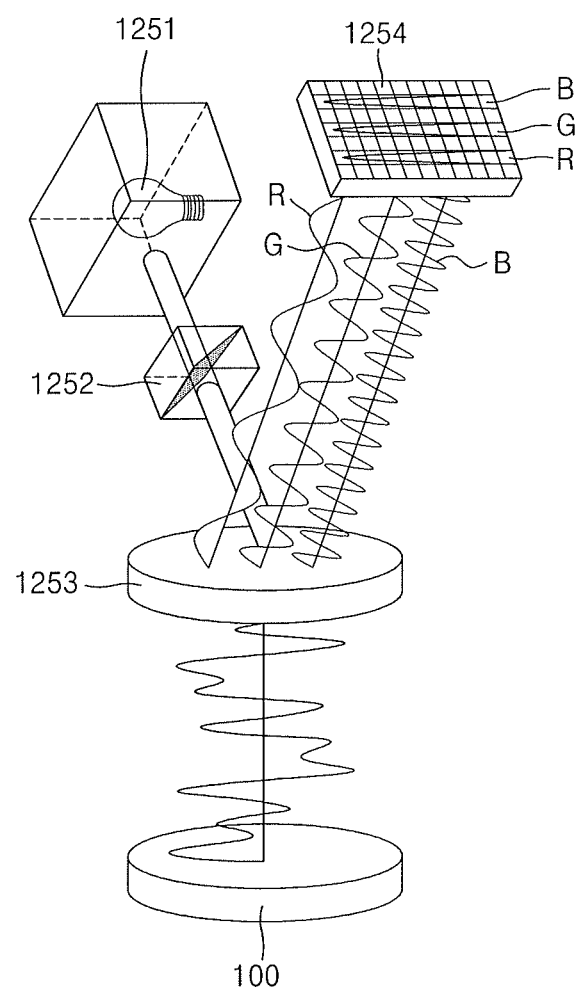

Referring to FIG. 4C, the GDD measurement device 1250 may include a fifth light source 1251, a polarizer 1252, a metal mirror 1253, and a spectrometer 1254. Light passing through the polarizer 1252 may pass through the metal mirror 1253 and may reach the semiconductor structure 100. In a metal structure, remaining group delay may be close to zero and a reflectance may be about 90%. Light reflected to the semiconductor structure 100 may again pass through the metal mirror 1253 and may be analyzed by the spectrometer 1254. Referring to FIG. 4C, the GDD measurement device 1250 is illustrated as including a reflection-type optical system, but may be a transmission-type optical system.

According to some embodiments, the GDD measurement device 1250 may measure a spectrum of GDD of the semiconductor structure 100. The GDD (or two-order dispersion) may denote differentiation of group delay of an angular frequency or a two-order differential value of a variation of a spectrum phase. The GDD may be defined by the following Equation (1):

$$D_2(\omega) = -\frac{\partial T_g}{\partial \omega} = \frac{d^2\phi}{d\omega^2}. \tag{1}$$

The GDD may be an arrival time difference (i.e., delay time dispersion of each group) between a pre-pulse and a post-pulse, and may be expressed as a multiplication of a thickness L of a medium and group velocity dispersion (GVD), which is GVD based on a wavelength value of the medium.

The semiconductor structure 100 of FIG. 2 may include a multi-layer structure, and thus, chirp may occur in a reflection process. Here, the chirp may denote that dispersion of a pulse increases or decreases when a pulse signal is propagated through an interaction with a medium having a dispersion characteristic. In more detail, a pulse reflected to the multi-layer structure may be chirped, and thus, a component having a relatively short wavelength may reach the multi-layer structure first and then a component having a relatively long wavelength may reach the multi-layer structure. Generally, the GDD may be used as a parameter for characterizing a mirror including a plurality of layers where GVD is not defined, and thus, may be an optical parameter suitable for characterizing the semiconductor structure 100 (see FIG. 2).

A configuration of optical measurement equipment (1200 see FIG. 1) illustrated in FIGS. 4A to 4C is an example, but the optical measurement equipment (1200 see FIG. 1) may include an optical system having an arbitrary configuration for measuring a reflectance, a polarization reflectance, polarization reflection delay, and GDD.

Referring again to FIGS. 1 and 2, the semiconductor structure 100, on which inspection by the optical measurement module 1200 is completed, may be inspected by the thickness measurement module 1300. The thickness measurement module 1300 may measure a thickness of the semiconductor structure 100. Positions at which thicknesses of the first and second semiconductor material layers 111 and 112 are measured may be positions at which reflectance, polarization reflectance, polarization reflection delay, and GDD spectrums are measured. A value obtained by multiplying the number of semiconductor structures 100 used for measurement by each measurement point may be the total number of sets of data. For example, in a case of performing measurement of an optical characteristic and a thickness at thirteen different horizontal positions with respect to each of 144 semiconductor structures 100, the total number of sets of data may be 1,872.

Figure 5B:
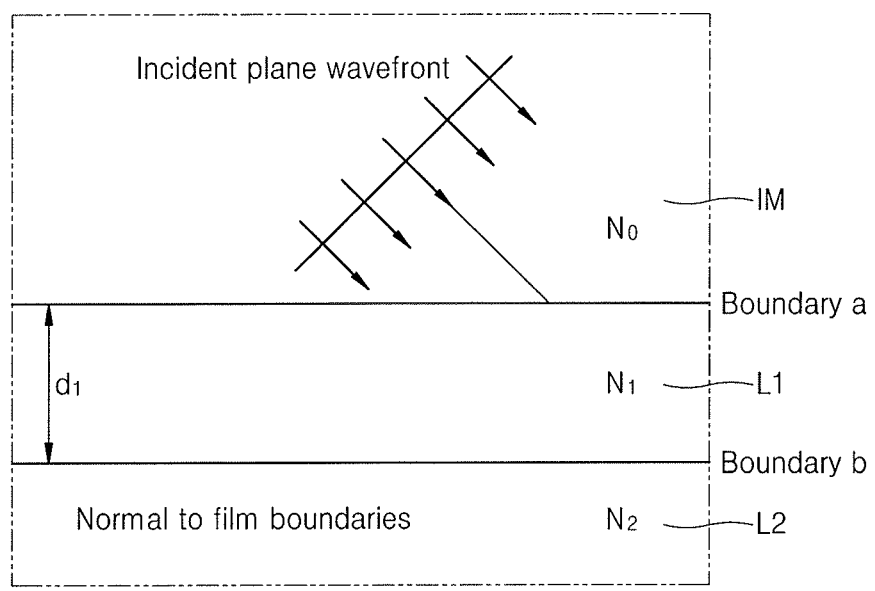
FIG. 5B illustrates an operation of the simulation network of FIG. 5A.

FIG. 5A is a block diagram for describing a simulation network 1500a included in the semiconductor material deposition equipment 1000 according to some embodiments. FIG. 5B is a conceptual view for describing an operation of the simulation network 1500a of FIG. 5A.

Referring to FIGS. 3A and 5A to 7, in operation P120, the simulation networks 1500a to 1500c may be trained. In more detail, referring to FIG. 5A, the simulation network 1500a according to some embodiments may include a spectrum modeling simulator 1510a and a model-based network 1520a.

Here, an operation of the spectrum modeling simulator 1510a will be described with reference to FIG. 5B. Referring to FIG. 5B, a plane wave incident from an incident medium IM on a first layer L1 and a second layer L2, which are dielectric layers having different refractive indexes, is illustrated. A thickness of the first layer L1 may be a first thickness d1, a refractive index of the first layer L1 may be $N_1$, and a refractive index of the second layer L2 may be N2. A boundary a may be an interface between the incident medium IM and the first layer L1, and a boundary b may be an interface between the first layer L1 and the second layer L2. In this case, Ea and Ha, which are respective magnitudes of an electric field E and a magnetic H field of the plane wave at the boundary a, and Eb and Hb, which are respective magnitudes of an electric field E and a magnetic H field of the plane wave at the boundary b, may satisfy the following Equation (2):

$$\begin{bmatrix} E_a \\ H_a \end{bmatrix} = \begin{bmatrix} \cos\delta & (i\sin\delta)/N_1 \\ iN_1\sin\delta & \cos\delta \end{bmatrix} \begin{bmatrix} E_b \\ H_b \end{bmatrix} \quad (2)$$

where i denotes a unit imaginary number and δ denotes a phase thickness of the first layer L1 defined as in the following Equation (3):

$$\delta = 2\pi N_1 d_1 \cos\theta_1/\lambda \quad (3)$$

where λ denotes a length of a wavelength of the plane wave in vacuum.

As in the semiconductor structure 100 (see FIG. 2), when the first and second semiconductor material layers 111 and 112 (see FIG. 2) are iteratively stacked, a level of an electric field at each interface may be obtained by using a chain multiplication of matrix of Equation (2). By using such a characteristic, a reflectance R of the semiconductor structure 100 (see FIG. 2) may be induced as in the following Equation (4):

$$R = \left(\frac{\eta_0 B - C}{\eta_0 B + C}\right)\left(\frac{\eta_0 B - C}{\eta_0 B + C}\right)^* \quad (4)$$

where coefficients B and C used to determine a reflectance of the semiconductor structure 100 (see FIG. 2) may be calculated by the following Equation (5). Here, a superscript "*" may be used to refer to a conjugate complex number:

$$\begin{bmatrix} B \\ C \end{bmatrix} = \left\{\prod_{r=1}^{q} \begin{bmatrix} \cos\delta_r & (i\sin\delta_r)/N_r \\ iN_r\sin\delta_r & \cos\delta_r \end{bmatrix}\right\}\begin{bmatrix} 1 \\ N_m \end{bmatrix} \quad (5)$$

where q denotes the total number of layers, Nr denotes a refractive index of an rth layer, and Nm denotes a refractive index of the substrate 101.

Referring to FIGS. 1, 2, and 5A, the spectrum modeling simulator 1510a may generate sets of model-based spectrum data by applying data of a thickness of each of the first and second semiconductor material layers 111 and 112 measured by the thickness measurement module 1300 and a known refractive index of each of the first and second semiconductor material layers 111 and 112 to a physical model corresponding to a multi-layer structure including a plurality of dielectric layers described above with reference to FIG. 5A.

Likewise, the spectrum modeling simulator 1510a may generate sets of model-based spectrum data of a polarization reflectance spectrum, polarization reflection delay, and GDD by using physical modeling. Hereinafter, sets of data of spectrums of a reflectance, a polarization reflectance, polarization reflection delay, and GDD generated by the spectrum modeling simulator 1510a may be referred to as sets of model-based spectrum data. A process of obtaining sets of model-based spectrum data from sets of thickness measurement data is illustrated by an arrow A2 in FIG. 3B.

According to some embodiments, in a learning process of the model-based network 1520a, the sets of model-based spectrum data may be an input I of the model-based network 1520a, which is illustrated by an arrow A3 of FIG. 3B. According to some embodiments, in a learning process of the model-based network 1520a, sets of first spectrum measurement data of the semiconductor structure 100 corresponding to thickness measurement data for calculating the sets of model-based spectrum data may be an output O of the model-based network 1520a, which is illustrated by an arrow A4 of FIG. 3B. That is, a process of allowing the model-based network 1520a to learn, i.e., training the model-based network 1520a, may include a process of updating parameters of hidden layers included in the model-based network 1520a under a condition where the sets of model-based spectrum data are the input I and the sets of first spectrum measurement data corresponding thereto are the output O.

According to some embodiments, the model-based network 1520a may include first to third hidden layers HL1 to HL3. According to some embodiments, the first hidden layer HL1 may include a plurality of first hidden units HU1, the second hidden layer HL2 may include a plurality of second hidden units HU2, and the third hidden layer HL3 may include a plurality of third hidden units HU3. Here, the number of first hidden units HU1 may be equal to the number of input features of the first hidden layer HL1, the number of second hidden units HU2 may be equal to the number of input features of the second hidden layer HL2, and the number of third hidden units HU3 may be equal to the number of input features of the third hidden layer HL3. According to some embodiments, the number of first hidden units HU1 may be less than the number of input I features. According to some embodiments, the number of second hidden units HU2 may be greater than the number of first hidden units HU1. According to some embodiments, the number of second hidden units HU2 may be greater than the number of third hidden units HU3. According to some embodiments, the number of third hidden units HU3 may be equal to the number of first hidden units HU1. According to some embodiments, the number of output O pitches may be greater than the number of third hidden units HU3. According to some embodiments, the number of output O pitches may be equal to the number of input I features.

The first to third hidden layers HL1 to HL3 may perform batch normalization on an input corresponding to each hidden layer so as to prevent overfitting. The batch normalization may be a method of solving gradient vanishing or gradient exploding to enhance the stability of an artificial neural network. The batch normalization may denote a process where input features are divided into mini-batches, and then, inputs in learning are normalized so that a mean of mini-batches is 0 and a variance of the mini-batches is 1.

The first to third hidden layers HL1 to HL3 may perform an activation for nonlinearly converting a batch-normalized input. The activation may be performed by an activation function. The activation may prevent an over-layer problem and may enhance a learning speed. According to some embodiments, the activation function may be one of nonlinear functions such as rectified linear unit (ReLU), parametric rectified linear unit (PReLU), hyperbolic tangent (tan h), and sigmoid. Here, the ReLu function may be expressed as $ReLu(x)=max(0, x)$ and may be a function which compares an input value with 0 to output a greater value. According to some embodiments, an activation function of each of the first and second hidden layers HL1 and HL2 may be an ReLU function, and an activation function of the third hidden layer HL3 may be a hyperbolic tangent function.

An algorithm applied to a gradient update of the model-based network 1520a may be an Adam optimizer. A learning speed has been set in the model-based network 1520a, and by applying feature normalization, hyper parameter tuning has been performed. Here, the hyper parameter tuning may denote that different restriction conditions, weight values, or learning speeds are applied to the same machine learning model, for generalizing different data patterns.

Figure 6:
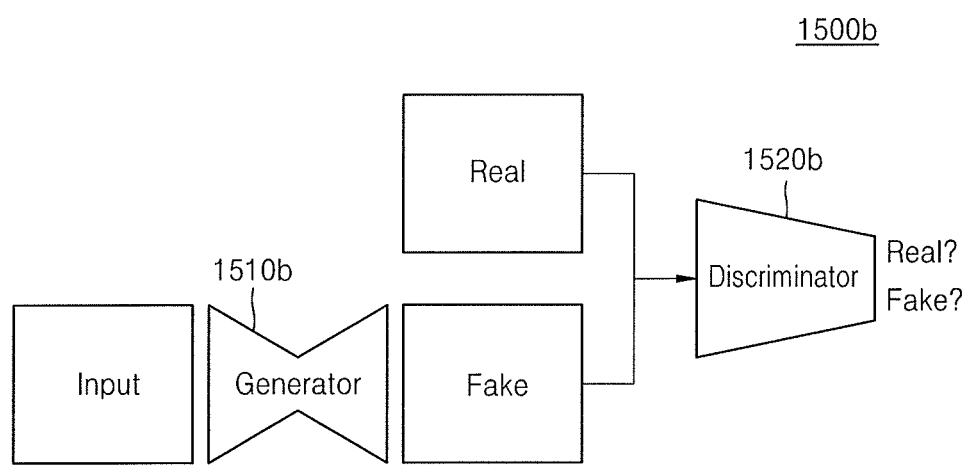
FIGS. 6 and 7 illustrate simulation networks included in a semiconductor material deposition equipment according to some other embodiments.

FIG. 6 is a block diagram for describing a simulation network 1500b according to some other embodiments. Referring to FIG. 6, the simulation network 1500b may be a generative adversarial network (GAN). According to some embodiments, the simulation network 1500b may include a generator network 1510b and a discriminator network 1520b. In order to learn a distribution pg of the generator network 1510b corresponding to data x, mapping of a next data space where a pre-input noise variable pz(z) is defined may be represented by $G(z; \theta g)$. Here, G may be a differential function represented by a multi-layer perceptron having a parameter θg. Also, a second multi-layer perceptron $D(x; \theta d)$, which outputs a single scalar, may be defined. Here, D(x) may represent a probability that x is obtained from real data instead of pg. An objective function of each of the generator network 1510b and the discriminator network 1520b may be defined by the following Equation (6):

$$\min_G \max_D V(D,G)=E_{x \sim P_{data(x)}}[\log D(x)]+E_{z \sim p_z(z)}[\log(1-D(G(z)))] \qquad (6)$$

Referring to Equation (6), an objective of the generator network 1510b may generate simulation data close to real measurement data for deceiving a discriminator. An objective of the discriminator network 1520b may be that real measurement data is actually classified and data generated by the generator network 1510b is falsely classified. The discriminator network 1520b may be trained to maximize a probability of discriminating learning data from data generated by the generator network 1510b.

Referring to Equation (6), when the generator network 1510b transfers noise G(z), calculated by using zero-mean Gaussian, to the discriminator network 1520b, the discriminator network 1520b may be trained to calculate a high probability (i.e., reduce 1−D(G(z))). The generator network 1510b may be iteratively updated so that the discriminator network 1520b does not discriminate real data from virtual data generated by the generator network 1510b.

The discriminator network 1520b may be trained such that, when real data is input, a high probability is calculated (i.e., increase D(x)), and when fake data G(z) is input, a low probability is calculated (i.e., increase 1−D(G(z))). The discriminator network 1520b may be iteratively updated to well discriminate the real data from the virtual data generated by the generator network 1510b.

The generator network 1510b and the discriminator network 1520b may not simultaneously learn. In more detail, the generator network 1510b may be trained in a state where the discriminator network 1520b is fixed and the discriminator network 1520b may be trained in a state where the generator network 1510b is fixed.

An objective function of the discriminator network 1520b may input m sets of real data and m sets of fake data generated by the generator network 1510b in a state where a parameter of the generator network 1510b is fixed, calculate an objective function V based on Equation (6), calculate a gradient of the objective function V of the discriminator network 1520b, and increase the objective function V, thereby updating a parameter of the discriminator network 1520b.

An objective function of the generator network 1510b may calculate an objective function V based on Equation (6) by generating m sets of fake data in a state where a parameter of the discriminator network 1520b is fixed, calculate a gradient of the objective function V of the generator network 1510b, and decrease the objective function V, thereby updating a parameter of the generator network 1510b.

Figure 7:
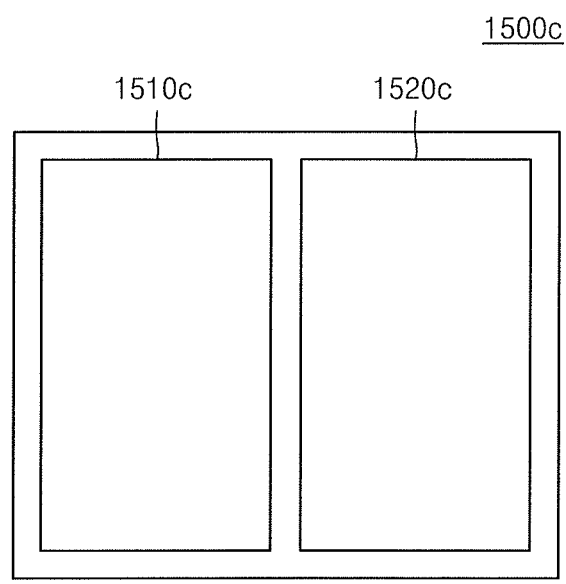

FIG. 7 illustrates a simulation network 1500c according to some other embodiments. Referring to FIG. 7, the simulation network 1500c may include first and second simulation networks 1510c and 1520c. According to some embodiments, the first simulation network 1510c may be the simulation network 1500a described above with reference to FIG. 5A. The first simulation network 1510c may be trained-based on a manner described above with reference to FIGS. 5A and 5B. According to some embodiments, the second simulation network 1520c may be the simulation network 1500b described above with reference to FIG. 6. The second simulation network 1520c may be trained based on a manner described above with reference to FIG. 6.

Subsequently, referring to FIGS. 1 and 3A, in operation P130, spectrum simulation data may be generated. According to some embodiments, the spectrum simulation data may include spectrums of a reflectance, a polarization reflectance, polarization reflection delay, and GDD of each of the semiconductor structures 100. According to some embodiments, the spectrum simulation data may be generated by one of the simulation network 1500a of FIG. 5A, the simulation network 1500b of FIG. 6, and the simulation network 1500c of FIG. 7.

In this case, measurement spectrums obtained by the optical measurement module 1200 and the thickness measurement module 1300 and sets of spectrum simulation data generated by the simulation networks 1500a to 1500c may be classified into sets of learning spectrum simulation data for allowing the thickness prediction network 1600 to learn, i.e., training the thickness prediction network 1600, and verification data for verifying a learning result of the thickness prediction network 1600.

Figure 8:
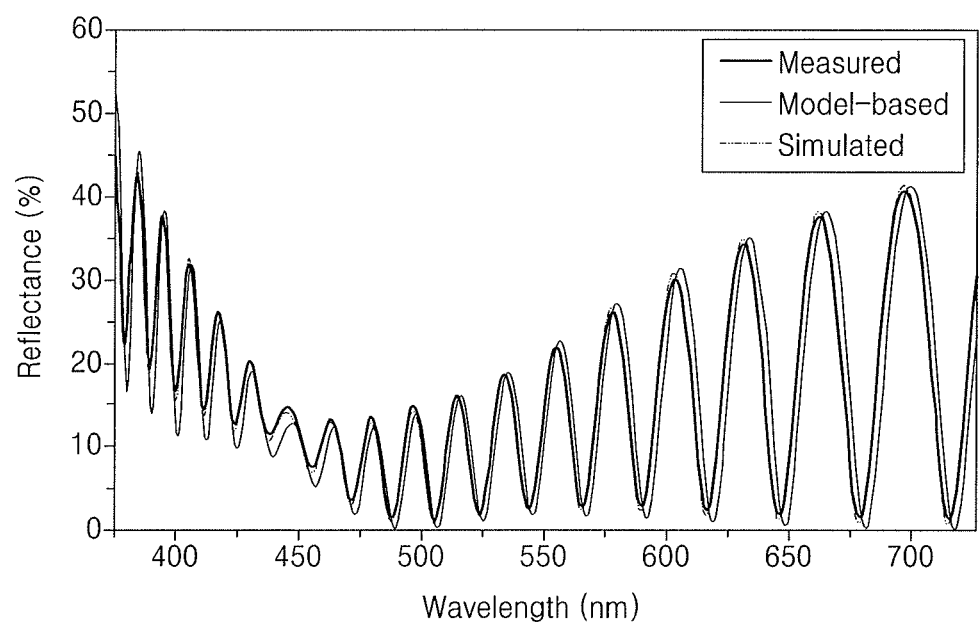
FIG. 8 is a graph for describing an effect of the simulation network of FIG. 5A.

FIG. 8 is a graph for describing an effect of the simulation network 1500a of FIG. 5A. Referring to FIG. 8, a measurement spectrum of a reflectance measured by an optical measurement module (1200 see FIG. 1), spectrum simulation data of a reflectance generated by the simulation network 1500a FIG. 5A, and model-based spectrum data of a reflectance generated by the spectrum modeling simulator 1510a are shown.

In more detail, model-based spectrum data of a reflectance may be generated by inputting a thickness measurement value of each of the semiconductor structures 100, which are not used in learning of the simulation network 1500a, to the spectrum modeling simulator 1510a. Subsequently, spectrum simulation data of the reflectance may be generated by inputting the model-based spectrum data of the reflectance to the model-based network 1520a.

Referring to FIG. 8, it may be confirmed that the model-based spectrum data of the reflectance has a difference with a measurement spectrum of the reflectance in a whole wavelength range, but the spectrum simulation data of the reflectance substantially matches the measurement spectrum of the reflectance in a measurement wavelength range.

As described below, more sets of data (i.e., spectrums and a thickness of semiconductor material layers included in a semiconductor structure corresponding thereto) may be needed for enhancing the performance of a thickness prediction network. However, much cost and time are needed for performing TEM inspection (which is destructive inspection) on a plurality of semiconductor structures (100 see FIG. 2).

According to some embodiments, massive sets of spectrum simulation data, which are substantially the same as measurement reflectance, polarization reflectance, polarization reflection delay, and GDD spectrums, may be generated by using the simulation networks 1500a to 1500c of FIGS. 5A to 7. The thickness prediction network 1600 may be trained based on the generated massive sets of spectrum simulation data, and thus, the reliability of learning of the thickness prediction network 1600 may be enhanced.

According to some embodiments, the simulation networks 1500a to 1500c of FIGS. 5A to 7 may generate massive sets of spectrum simulation data corresponding to a case where first and second semiconductor material layers have different arbitrary thicknesses unlike a real semiconductor structure (100 see FIG. 2). According to some embodiments, the simulation networks 1500a to 1500c of FIGS. 5A to 7 may generate massive sets of spectrum simulation data as a function of continuous thicknesses of the first and second semiconductor material layers having. Accordingly, the thickness prediction network 1600 may predict a thickness of first and second semiconductor material layers (111 and 112 see FIG. 2) in a case where a thickness of some of the first and second semiconductor material layers increases or decreases abnormally.

Figure 9:
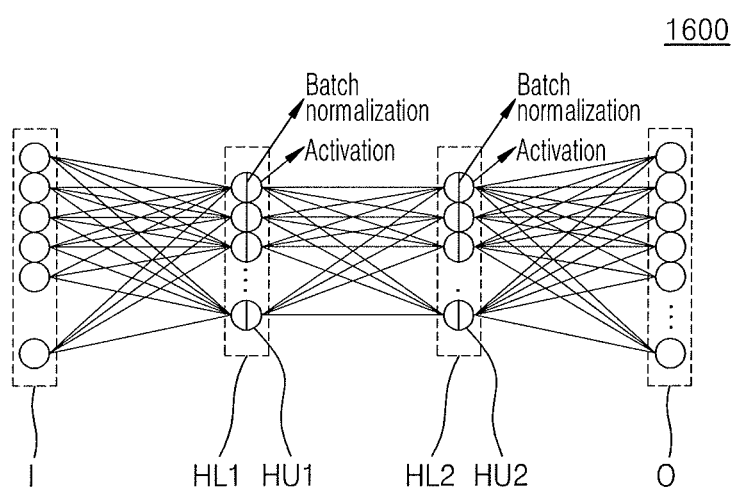
FIG. 9 illustrates a thickness prediction network included in a semiconductor material deposition equipment.

FIG. 9 is a block diagram for describing a thickness prediction network 1600 included in a semiconductor material deposition equipment (1000 see FIG. 1). Referring to FIGS. 1, 3A, and 9, in operation P140, the thickness prediction network 1600 may be trained. Data may include artificial data and real data. The artificial data may include spectrum simulation data and thickness conditions of first and second semiconductor material layers (111 and 112 see FIG. 2) used to generate the spectrum simulation data and is illustrated by an arrow A5 in FIG. 3B. the real data may include sets of first spectrum measurement data and sets of thickness measurement data and is illustrated by an arrow A6 in FIG. 3B.

The thickness prediction network 1600 may be one of a neural network and a deep neural network. An input I of the thickness prediction network 1600 may include sets of first spectrum measurement data obtained by the optical measurement module 1200 and sets of spectrum simulation data obtained by the simulation networks 1500a to 1500c. An output O of the thickness prediction network 1600 may include measurement data of thicknesses of the first and second semiconductor material layers (111 and 112 see FIG. 2) included in the semiconductor structure (100 see FIG. 2), and thickness conditions of first and second semiconductor material layers (111 and 112 see FIG. 2) used to generate the sets of spectrum simulation data obtained by the simulation networks 1500a to 1500c.

The thickness prediction network 1600 may include first and second hidden layers HL1 and HL2. According to some embodiments, the first and second hidden layers HL1 and HL2 may perform batch normalization and activation.

According to some embodiments, an activation function for activating the first and second hidden layers HL1 and HL2 may be, e.g., one of nonlinear functions such as ReLU, PReLU, hyperbolic tangent, sigmoid, and the like. According to some embodiments, an activation function of each of the first and second hidden layers HL1 and HL2 may be the ReLU function.

An algorithm applied to a gradient update of the thickness prediction network 1600 may be an Adam optimizer. A learning speed has been set in the thickness prediction network 1600, and by applying feature normalization, hyper parameter tuning has been performed.

According to some embodiments, the first hidden layer HL1 may include a plurality of first hidden units HU1, and the second hidden layer HL2 may include a plurality of second hidden units HU2. According to some embodiments, the number of first hidden units HU1 may be less than the number of input I features, and the number of second hidden units HU2 may be less than the number of input I features. According to some embodiments, the number of first hidden units HU1 may be equal to the number of second hidden units HU2. According to some embodiments, the number of first hidden units HU1 may be greater than the number of output O features, and the number of second hidden units HU2 may be greater than the number of output O features.

Subsequently, referring to FIGS. 2, 3A, and 9, in operation P150, a learning result of the thickness prediction network 1600 may be verified based on the artificial data and the real data, which are not used in the thickness prediction network 1600. Verification of the learning result of the thickness prediction network 1600 is illustrated by the arrow A5 and the arrow A6 of FIG. 3B.

According to some embodiments, verifying the learning result of the thickness prediction network 1600 may include comparing the thicknesses of the first and second semiconductor material layers 111 and 112, which are the output O of the thickness prediction network 1600 when the spectral simulation data and the first spectral measurement data not used for learning are input I of the thickness prediction network 1600, to the measured thicknesses of the first and second semiconductor material layers 111, 112 and/or the thicknesses of the first and second semiconductor material layers 111, 112 used as the conditions of the simulation.

Hereinafter, an effect according to some embodiments will be described with reference to FIGS. 10A to 12. FIGS. 10A to 12 are graphs for describing effects of a semiconductor device manufacturing method according to some embodiments.

Figure 10A:
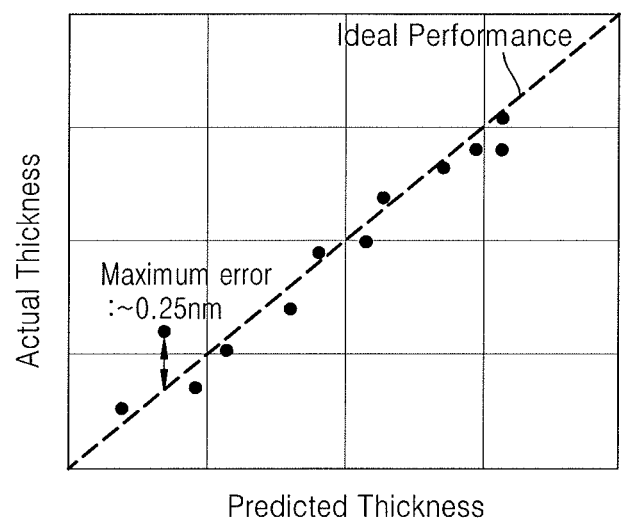
FIGS. 10A to 12 are graphs for describing effects of a semiconductor device manufacturing method according to some embodiments.
Figure 10B:
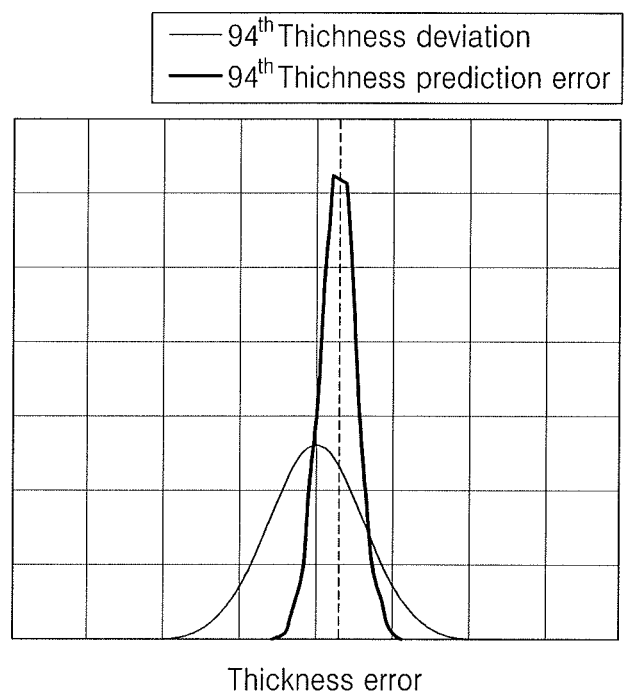
Figure 11:
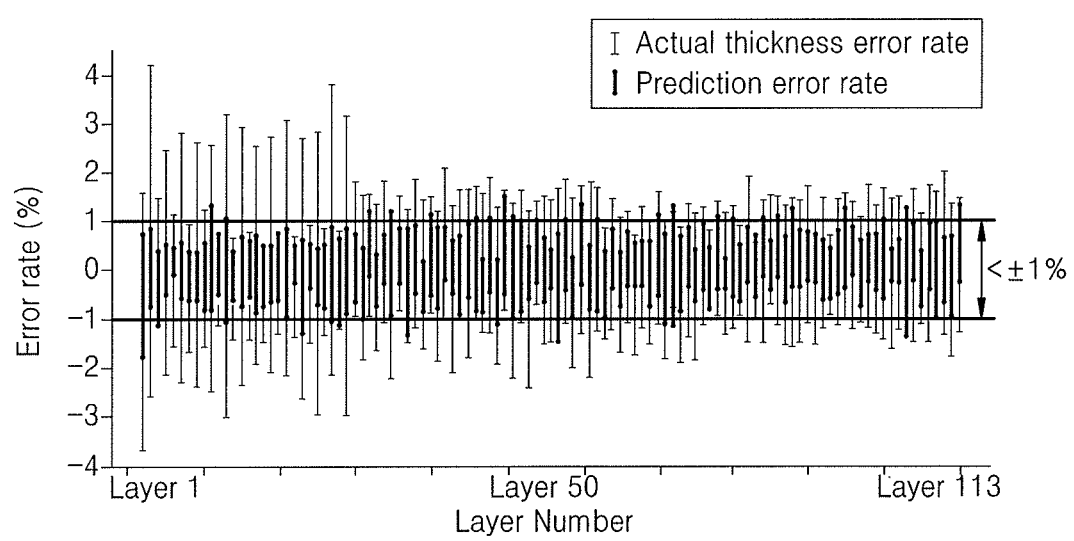
Figure 12:
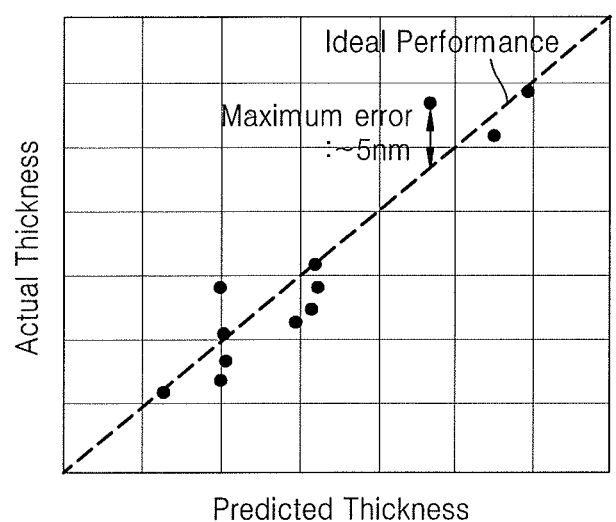

In more detail, FIG. 10A shows a result obtained by comparing a prediction value with a measurement value of a thickness of a 94th-stacked semiconductor material layer of a plurality of first and second semiconductor material layers, which are stacked, and FIG. 10B shows a distribution of measured thicknesses and a distribution of predicted thicknesses for each semiconductor structure (100 see FIG. 2). FIG. 11 shows a process error and an error of a predicted total thickness of a plurality of first and second semiconductor material layers, which are stacked. FIG. 12 shows a prediction value corresponding to a sum of a thicknesses of some of a plurality of stacked semiconductor material layers.

Referring to FIG. 10A, the abscissa axis represents a predicted thickness of the 94th-stacked semiconductor material layer, and the ordinate axis represents an actual thickness (i.e., a measurement thickness) of the 94th-stacked semiconductor material layer. A dashed line is a straight line representing a case where the measurement thickness of the 94th-stacked semiconductor material layer matches a prediction thickness. Referring to FIG. 10A, it may be confirmed that a maximum value of an error is about 0.25 nm and an accuracy of thickness prediction is very high.

Referring to FIG. 10B, a probability density function of a measurement thickness of a 94th layer of a semiconductor structure (100 see FIG. 2) and a probability density function of an error of a prediction thickness are shown. Referring to FIG. 10B, it may be confirmed that a prediction thickness error is distributed narrower in range than a distribution of a measurement thickness of a 94th layer. That is, it may be confirmed that a range of thickness prediction has a value within a process distribution range, and thus, the reliability of thickness prediction is very high.

Referring to FIG. 11, percentages of an actual thickness error rate and a prediction thickness error rate of each of first and second semiconductor material layers are shown by bar graphs. Here, the actual thickness error rate represents a percentage of a value obtained by dividing, by a designed thickness, a difference between a designed thickness and a measured thickness of the first and second semiconductor material layers. Here, the prediction thickness error rate represents a percentage of a value obtained by dividing a difference between a predicted thickness and a measured thickness by the measured thickness. Referring to FIG. 11, it may be confirmed that the prediction thickness error rate is about ±1%, and thus, an accuracy of thickness prediction is very high.

Referring to FIG. 12, a sum of thicknesses of the first-stacked layer to the 29th-stacked layer of a plurality of first and second semiconductor material layers stacked on a substrate is shown. Referring to FIGS. 9 and 12, the abscissa axis represents a prediction value of a sum of thicknesses of first to 29th layers and the ordinate axis represents a measurement value of a sum of thicknesses of the first to 29th layers. A dashed line is a straight line representing a case where a measurement value and a prediction value of a sum of thicknesses match therebetween. Referring to FIG. 12, it may be confirmed that a maximum value of an error is about 5 nm and an accuracy of thickness prediction is very high.

According to some embodiments, unlike a case where learning is performed to predict a thickness of each of a plurality of first and second semiconductor material layers, the thickness prediction network 1600 may be trained to predict a sum of thicknesses of some of the plurality of first and second semiconductor material layers and may predict a thickness of the first and second semiconductor material layers, thereby enhancing a learning speed and a calculation speed of the thickness prediction network 1600.

Figure 13:
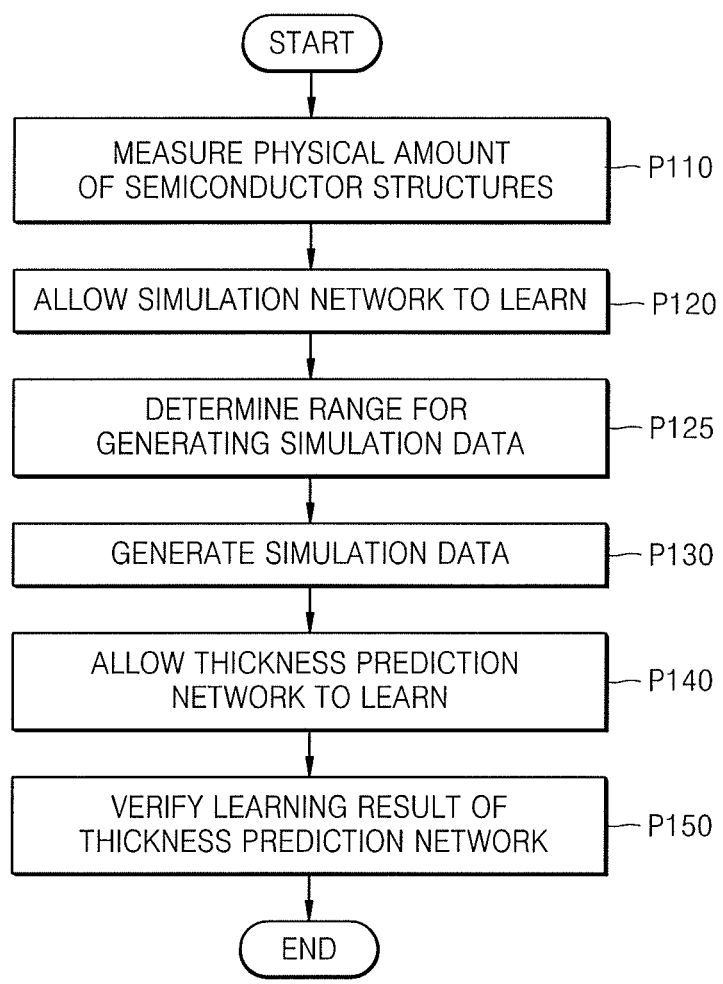
FIG. 13 is a flowchart for describing a thickness prediction network learning method according to some embodiments.

FIG. 13 is a flowchart for describing a thickness prediction network learning method according to some embodiments. For convenience of description, descriptions given above with reference to FIGS. 3 to 9 will not be repeated, and a difference will be mainly described below.

Referring to FIGS. 1 to 13, in operation P110, the physical amount of the semiconductor structures 100 may be measured, and in operation P120, the simulation networks 1500a to 1500c may be trained, as described above. Then, in operation P125, a wavelength band for generating sets of spectrum simulation data may be determined before generating the sets of spectrum simulation data. The remaining operations P130 to P150 are the same as those described above.

The operation P125 of determining the wavelength band for generating the sets of spectrum simulation data may include an operation of comparing sets of spectrum simulation data, generated from sets of thickness measurement data which are not used in learning of the simulation networks 1500a to 1500c, with sets of first spectrum measurement data corresponding to the sets of thickness measurement data which are not used in the learning. According to some embodiments, the sets of spectrum simulation data may partially match the sets of first spectrum measurement data. That is, the sets of spectrum simulation data may match the sets of first spectrum measurement data in only a portion of a wavelength band where the sets of first spectrum measurement data are measured.

In this case, each of the simulation networks 1500a to 1500c may generate the sets of spectrum simulation data in only a wavelength band where the sets of spectrum simulation data match the sets of first spectrum measurement data. Therefore, the thickness prediction network 1600 may be trained on, as an input, the sets of first spectrum measurement data and sets of spectrum data of a wavelength band.

According to some embodiments, the thickness prediction network 1600 may be trained on a range where a simulation network generates accurate spectrum simulation data, thereby enhancing a learning speed and reliability of a thickness prediction network.

Figure 14:
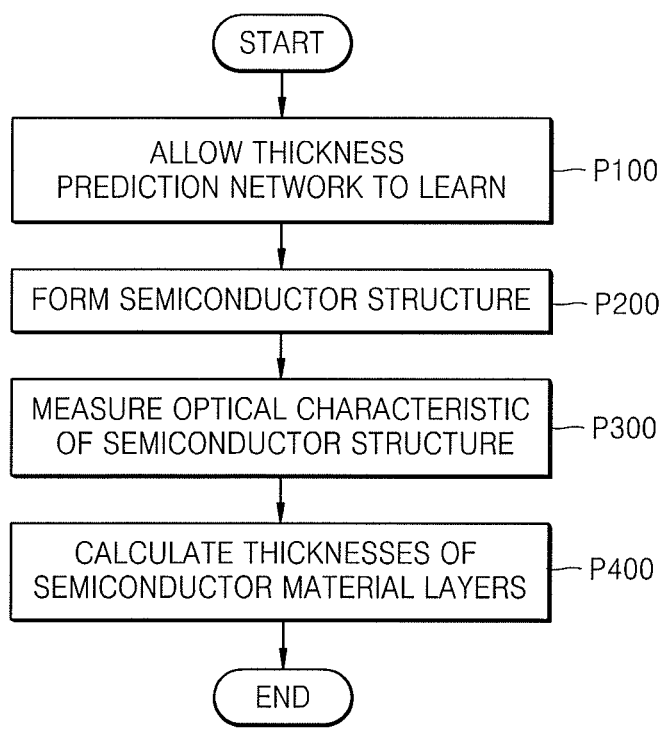
FIG. 14 is a flowchart for describing a semiconductor device manufacturing method according to some embodiments.

FIG. 14 is a flowchart for describing a semiconductor device manufacturing method according to some embodiments. Referring to FIGS. 1 and 14, in operation P100, the thickness prediction network 1600 may be trained. Learning of the thickness prediction network 1600 may be performed through a series of processes corresponding to P110 to P150 described above with reference to FIGS. 3 and 9 or a series of processes corresponding to P110 to P150 described above with reference to FIG. 10.

Referring to FIGS. 1, 2, and 14, in operation P200, the semiconductor structure 100 may be formed. An operation of forming the semiconductor structure 100 may include an operation of forming the first and second semiconductor material layers 111 and 112, which are alternately stacked, on the substrate 101 through processes, e.g., molecular beam epitaxy (MBE), CVD, such as, ALD, VPE, and UHV-CVD, and the like.

Referring to FIGS. 1, 2, and 14, in operation P300, an optical characteristic of the semiconductor structure 100 may be measured. According to some embodiments, the measured optical characteristic of the semiconductor structure 100 may include spectrums of a reflectance, a polarization reflectance, polarization reflection delay, and GDD. According to some embodiments, data of spectrums of a reflectance, a polarization reflectance, polarization reflection delay, and GDD measured after the learning of the thickness prediction network 1600 is performed may be referred to as second spectrum measurement data.

Unlike description given above with reference to FIG. 13, when generating spectrum simulation data corresponding to some of wavelength bands trained by the simulation networks 1500a to 1500c, the thickness prediction network 1600 may be trained within a range of the spectrum simulation data. Therefore, wavelength bands of sets of second spectrum measurement data may be limited to a wavelength band trained by the thickness prediction network 1600.

Referring to FIGS. 2, 9, and 14, in operation P400, thicknesses of the first and second semiconductor material layers 111 and 112 included in the semiconductor structure 100 may be predicted. According to some embodiments, thicknesses of each of the first and second semiconductor material layers 111 and 112 included in the semiconductor structure 100 may be predicted. According to some embodiments, a sum of thicknesses of some of the first and second semiconductor material layers 111 and 112 included in the semiconductor structure 100 may be predicted. According to some embodiments, a sum of thicknesses of the first and second semiconductor material layers 111 and 112 included in the semiconductor structure 100 may be predicted. According to some embodiments, when each of the sets of second spectrum measurement data of the semiconductor structure 100 is an input, the thickness of the first and second semiconductor material layers 111 and 112 of the semiconductor structure 100 may be an output O of the thickness prediction network 1600. According to some embodiments, since a thickness is predicted based on a spectrum measured at a plurality of positions of the semiconductor structure 100, the thicknesses of the first and second semiconductor material layers 111 and 112 may be predicted at the plurality of positions of the semiconductor structure 100. Furthermore, by applying a wafer methodology, a continuous distribution of the thicknesses of the first and second semiconductor material layers 111 and 112 with respect to a horizontal position may be seen.

One or more embodiments provide a semiconductor material deposition equipment. In more detail, one or more embodiments provides a thickness prediction network learning method, a semiconductor device manufacturing method, and a semiconductor material deposition equipment, in which total inspection and real-time process monitoring are performed on a semiconductor structure.

Embodiments are described, and illustrated in the drawings, in terms of functional blocks, units, modules, and/or methods. Those skilled in the art will appreciate that these blocks, units, modules, and/or methods are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units, modules, and/or methods being implemented by microprocessors or similar, they may be programmed using software (e.g., microcode) to perform various functions discussed herein and may optionally be driven by firmware and/or software. Alternatively, each block, unit, module, and/or method may be implemented by dedicated hardware, or as a combination of dedicated hardware to perform some functions and a processor (e.g., one or more programmed microprocessors and associated circuitry) to perform other functions. Also, each block, unit, and/or module of the embodiments may be physically separated into two or more interacting and discrete blocks, units and/or modules without departing from the scope of the disclosure. Further, the blocks, units and/or modules of the embodiments may be physically combined into more complex blocks, units and/or modules without departing from the scope of the disclosure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor material deposition equipment, comprising:
   a thickness prediction network that is trained using data derived from first spectrum measurement data of first and second semiconductor layers as inputs of the thickness prediction network and thickness measurement data of the first and second semiconductor layers as outputs of the thickness prediction network, the first and second semiconductor layers being part of a first semiconductor device that includes a first substrate and the first and second semiconductor layers alternately stacked on the first substrate;
   a deposition module that operates in a real-time process environment to form a second semiconductor structure including a second substrate and third and fourth semiconductor material layers alternately stacked on the second substrate; and
   an optical measurement module that performs real-time process monitoring of the second semiconductor structure to measure spectrums of optical characteristics of the second semiconductor structure to generate second spectrum measurement data, the optical measurement module including at least one of a reflectance measurement equipment configured to measure a spectrum of a reflectance of the second semiconductor structure, an ellipsometer configured to measure spectrums of a polarization reflectance and polarization phase delay of the second semiconductor structure, or a group delay dispersion (GDD) measurement equipment configured to measure a spectrum of GDD of the second semiconductor structure, wherein the thickness prediction network is configured to calculate thicknesses of at least some of the third and fourth semiconductor material layers using the second spectrum measurement data, which is input to the thickness prediction network.

2. The semiconductor material deposition equipment as claimed in claim 1, further comprising:

a thickness measurement module to generate the thickness measurement data by performing destructive measurement on the first semiconductor structure by measuring thicknesses of the first and second semiconductor material layers after the first spectrum measurement data is obtained from the optical measurement module measuring the first semiconductor structure; and a simulation network to learn based on the first spectrum measurement data measured from the first semiconductor structure and the thickness measurement data measured by the thickness measurement module, and to generate sets of spectrum simulation data, which are sets of artificial data of the optical characteristics determined based on the thicknesses of the first and second semiconductor material layers, wherein:

the thickness prediction network is configured to generate the trained model using the first spectrum measurement data and the sets of spectrum simulation data.

\* \* \* \* \*